United States Patent
Ohtomo et al.

(10) Patent No.: US 9,082,543 B2
(45) Date of Patent: Jul. 14, 2015

(54) INDUCTOR

(75) Inventors: Yusuke Ohtomo, Kanagawa (JP);
Hiroaki Katsurai, Kanagawa (JP);
Hidetoshi Onodera, Kyoto (JP); Akira Tsuchiya, Kyoto (JP)

(73) Assignees: NIPPON TELEGRAPH AND TELEPHONE CORPORATION, Tokyo (JP); KYOTO UNIVERSITY, Kyoto (JP)

( * ) Notice: Subject to any disclaimer, the term of this patent is extended or adjusted under 35 U.S.C. 154(b) by 249 days.

(21) Appl. No.: 13/823,716

(22) PCT Filed: Sep. 14, 2011

(86) PCT No.: PCT/JP2011/070993
§ 371 (c)(1),
(2), (4) Date: Jun. 3, 2013

(87) PCT Pub. No.: WO2012/036207
PCT Pub. Date: Mar. 22, 2012

(65) Prior Publication Data
US 2015/0035625 A1   Feb. 5, 2015

(30) Foreign Application Priority Data

Sep. 17, 2010  (JP) .................................. 2010-209549

(51) Int. Cl.
*H01F 5/00*  (2006.01)
*H01F 27/28*  (2006.01)
(Continued)

(52) U.S. Cl.
CPC ............ *H01F 27/2804* (2013.01); *H01F 27/29* (2013.01); *H01L 23/5227* (2013.01);
*H01L28/10* (2013.01); *H03F 3/195* (2013.01);
*H03F 3/45188* (2013.01); *H03H 11/02* (2013.01); *H01L 2924/0002* (2013.01); *H03F 2203/45731* (2013.01)

(58) Field of Classification Search
CPC ................................... H01F 5/00; H01F 27/28
USPC .................................................. 336/200, 232
See application file for complete search history.

(56) References Cited

U.S. PATENT DOCUMENTS 5,831,331 A * 11/1998 Lee ................................ 257/659
2002/0110936 A1  8/2002 Wada et al.
(Continued)

FOREIGN PATENT DOCUMENTS

CN          1361550 A    7/2002
JP          59-086318    5/1984
(Continued)

OTHER PUBLICATIONS

Jaeha Kim, et.al., "Design Optimization of On-Chip Inductive Peaking Structures for 0.13-µm CMOS 40-Gb/s Transmitter Circuits", IEEE Transactions on Circuits and Systems—I, vol. 56, No. 12, pp. 2544-2555, Dec. 2009.

*Primary Examiner* — Tsz Chan
(74) *Attorney, Agent, or Firm* — Blakely Sokoloff Taylor & Zafman (57) ABSTRACT

An inductor (1) includes an inductor (L11P) formed into the shape of a spiral on the outer circumference of an inductor region and having a start point connected to a terminal (N11P), an inductor (L12P) formed into the shape of a spiral on the inner circumference of the inductor region and having a start point at the end point of the inductor (L11P) and an end point connected to a terminal (N12P), and an inductor (L13P) formed into the shape of a spiral in a region sandwiched between the inductor (L11P) and the inductor (L12P) and having a start point at a node between the inductor (L11P) and the inductor (L12P) and an end point connected to a terminal (N13P).

8 Claims, 8 Drawing Sheets

(51) Int. Cl.
*H01L 23/522* (2006.01)
*H01L 49/02* (2006.01)
*H03F 3/195* (2006.01)
*H03F 3/45* (2006.01)
*H01F 27/29* (2006.01)
*H03H 11/02* (2006.01)

(56) References Cited

U.S. PATENT DOCUMENTS

2002/0158306 A1  10/2002  Niitsu
2008/0129434 A1* 6/2008  Khajehpour ............... 336/139
2011/0084791 A1* 4/2011  Mun et al. .................. 336/200
2011/0248811 A1* 10/2011 Kireev ....................... 336/200

FOREIGN PATENT DOCUMENTS

| | | |
|---|---|---|
| JP | H08-078964 A | 3/1996 |
| JP | 2001-274330 A | 10/2001 |
| JP | 2005-073234 A | 3/2005 |
| JP | 2007-005798 A | 1/2007 |
| JP | 2009-010826 A | 1/2009 |
| WO | WO 2007/110915 A1 | 10/2007 |

* cited by examiner

INDUCTOR

TECHNICAL FIELD

The present invention relates to an inductor that is mainly applicable to an inductor formed using a metal wiring layer in a semiconductor integrated circuit for handling a high-frequency signal, such as a transimpedance amplifier used in an optical reception module or a laser driving circuit used in an optical transmission module and, more particularly, to an inductor indispensable in a peaking circuit that implements a high frequency response.

BACKGROUND ART

A silicon CMOS transistor has the advantages of ensuring a high degree of integration and being capable of inexpensively providing semiconductor integrated circuits by mass production. On the other hand, since the silicon CMOS transistor has a cutoff frequency lower than that of a transistor using a compound semiconductor represented by InP, the operating frequency of a circuit becomes low. To solve this problem, a technique is widely used in which a metal wire is spirally wound to form an inductor, and the inductor is added to a load resistance or a feedback resistance of a transistor to construct a peaking circuit, thereby extending the band. According to the peaking circuit by the spiral inductor, the band of a semiconductor integrated circuit can be extended almost twice as compared to that before the use of the inductor. However, since the area of the inductor is much larger than the area of the transistor, the area of the semiconductor integrated circuit becomes large, and the cost of the semiconductor integrated circuit rises.

Figure 11A:
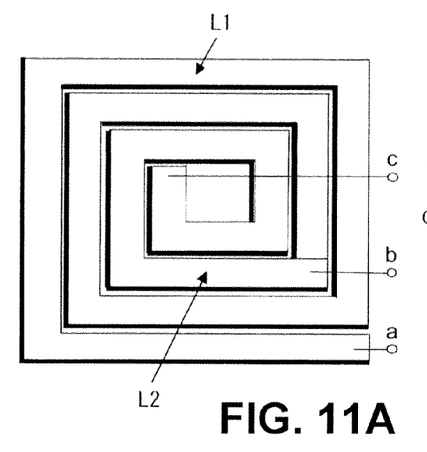
FIGS. 11A and 11B are plan views of conventional inductors of the double-shunt form.
Figure 11B:
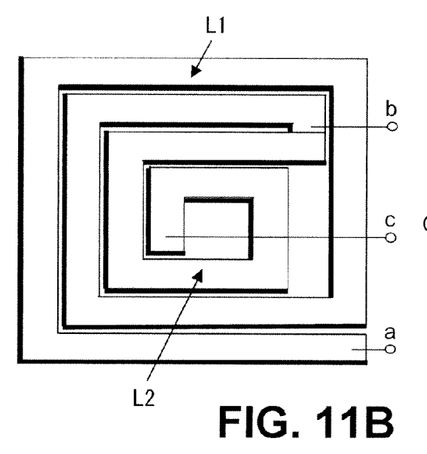
Figure 11C:
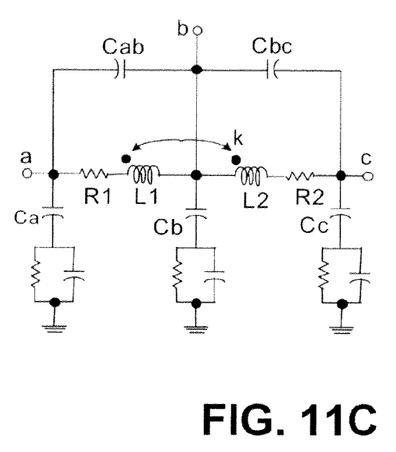
FIGS. 11C and 11D are equivalent circuit diagrams of the conventional inductors of the double-shunt form.
Figure 11D:
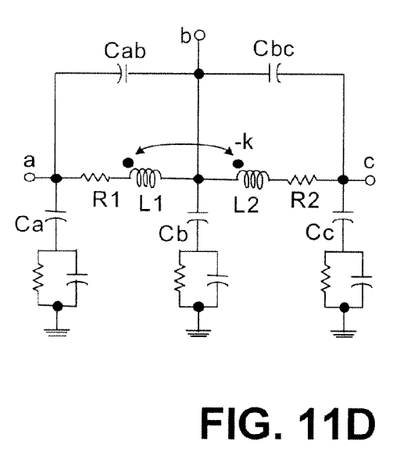

FIGS. 11A and 11B are plan views of conventional inductors disclosed in Jaeha Kim, et. al., "Design Optimization of On-Chip Inductive Peaking Structures for 0.13-μm CMOS 40-Gb/s Transmitter Circuits", IEEE Transactions on Circuits and Systems-I, Vol. 56, No. 12, pp. 2544-2555, December 2009" (to be referred to as literature 1 hereinafter). FIGS. 11C and 11D are equivalent circuit diagrams of the inductors shown in FIGS. 11A and 11B, respectively. Terminals a, b, and c in FIGS. 11A and 11B correspond to the terminals a, b, and c shown in FIGS. 11C and 11D. Referring to FIGS. 11A and 11B, two inductors L1 and L2 are used for peaking. In FIGS. 11C and 11D, k is the coupling coefficient between the inductors L1 and L2.

In the example shown in FIG. 11A, the two inductors L1 and L2 are continuously wound to form one inductor spiral. On the other hand, in the example shown in FIG. 11B, the inductor L2 is formed by winding it in a direction reverse to that of the inductor L1 so that the inductors L1 and L2 are coupled in a direction reverse to that in the example of FIG. 11A.

Figure 12:
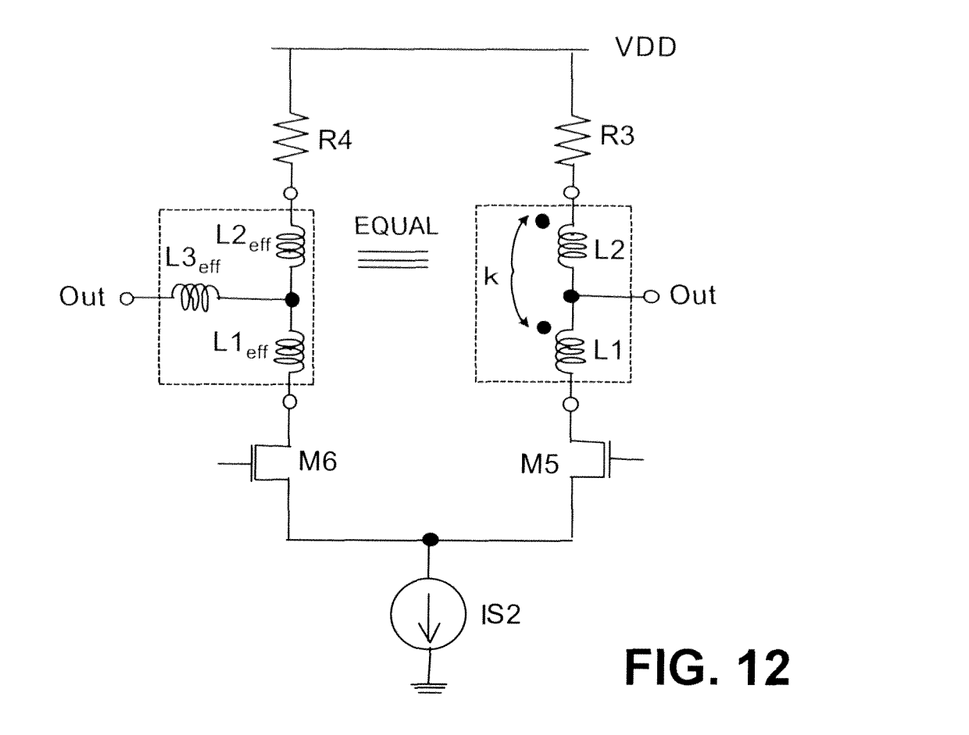
FIG. 12 is a circuit diagram showing a peaking circuit using the inductors of the double-shunt form and an equivalent circuit thereof.

FIG. 12 shows a circuit diagram of a peaking circuit disclosed in literature 1 and an equivalent circuit thereof. FIG. 12 illustrates an example in which the peaking circuit is used in a buffer circuit. The buffer circuit includes a transistor M5, a load resistance R3, and a current source IS2. The peaking circuit formed from the inductors L1 and L2 is inserted between the load resistance R3 and the drain of the transistor M5. The node of the inductors L1 and L2 is connected to an output terminal OUT of the buffer. The connection form of the inductors L1 and L2 cascaded as shown on the right side of FIG. 12 is referred to as a double-shunt form.

The equivalent circuit of the peaking circuit is shown on the left side of FIG. 12. That is, the peaking circuit formed from the inductors L1 and L2 of the double-shunt form is equivalent to a peaking circuit formed from inductors L1$eff$ and L2$eff$ of the double-shunt form and an inductor L3$eff$ inserted between the output terminal OUT and the node of the inductors L1$eff$ and L2$eff$. The inductor L3$eff$ is equivalently formed by inductive coupling of the inductors L1 and L2. The inductor connection form that connects the output node of a circuit and the circuit, like the inductor L3$eff$, is referred to as a series form.

DISCLOSURE OF INVENTION

Problems to be Solved by the Invention

When the series form is used in the peaking circuit in addition to the double-shunt form, the frequency band of the semiconductor integrated circuit can effectively be extended. In the peaking circuit disclosed in literature 1, the inductor L3$eff$ of the series form is equivalently formed. However, the inductor L3$eff$ and the inductors L1$eff$ and L2$eff$ of the double-shunt form do not form an inductive coupling. For this reason, the frequency band extension effect is restricted as compared to a case in which the double-shunt form and the series form are inductively coupled. In addition, the peaking circuit disclosed in literature 1 cannot use the inductive coupling associated with the inductor L3$eff$ as a design parameter. It is therefore difficult to design the peaking characteristic.

Literature 1 discloses a form in which two inductors of the double-shunt form are wound in one spiral but not a form in which three or more inductors are wound. Hence, to extend the frequency band of a circuit by inductively coupling the double-shunt form and the series form using the inductor structure disclosed in literature 1, the double-shunt form and the series form need to be constructed separately, and the area of the semiconductor integrated circuit increases. Especially when adding the peaking circuit to a differential circuit, the inductors for the peaking circuit are necessary on each of the positive-phase side and the negative-phase side of the circuit. For this reason, the area of the circuit considerably increases.

Furthermore, in the peaking circuit disclosed in literature 1, it is impossible to freely select the directivity of the inductive coupling between the double-shunt form and the series form.

The present invention has been made to solve the above-described problems, and has as its object to provide an inductor capable of reducing the area necessary for forming a peaking circuit and increasing the degree of freedom in designing the peaking characteristic.

Means of Solution to the Problems

An inductor according to the present invention comprises a first inductor wire formed into a shape of a spiral on an outer circumference of an inductor region and having a start point connected to a first terminal, a second inductor wire formed into a shape of a spiral on an inner circumference of the inductor region and having a start point at an end point of the first inductor wire and an end point connected to a second terminal, and a third inductor wire formed into a shape of a spiral in a region sandwiched between the first inductor wire and the second inductor wire and having a start point at a node between the first inductor wire and the second inductor wire and an end point connected to a third terminal.

Effects of the Invention

According to the present invention, three inductor wires can be formed in the area of one spiral. It is therefore possible to form, in a small area, a peaking circuit that uses three inductors and has a large band extension effect. In the present invention, the area of inductors necessary for forming the peaking circuit can be reduced to ½ as compared to a case in which the inductors of the double-shunt form and the inductors of the series form are provided in separate inductor regions. As a result, according to the present invention, it is possible to inexpensively provide a semiconductor integrated circuit that operates at a high speed. Additionally, in the present invention, the winding direction of each inductor wire and the distance between the inductor wires are changed at the time of design, thereby freely selecting the coupling coefficient and coupling direction between the inductor wires. Since this allows to adjust the relationship between the inductors and the capacitance, the degree of freedom in designing the peaking characteristic can be increased. As a result, according to the present invention, it is possible to enhance the band extension effect of the peaking circuit as compared to a case in which the conventional inductors are used.

BEST MODE FOR CARRYING OUT THE INVENTION

First Embodiment

Figure 1:
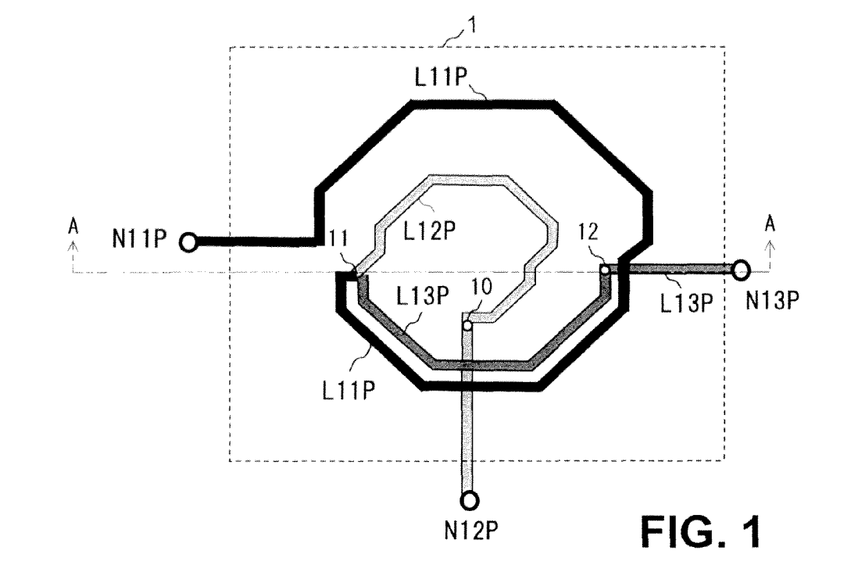
FIG. 1 is a plan view of an inductor according to the first embodiment of the present invention.
Figure 2:
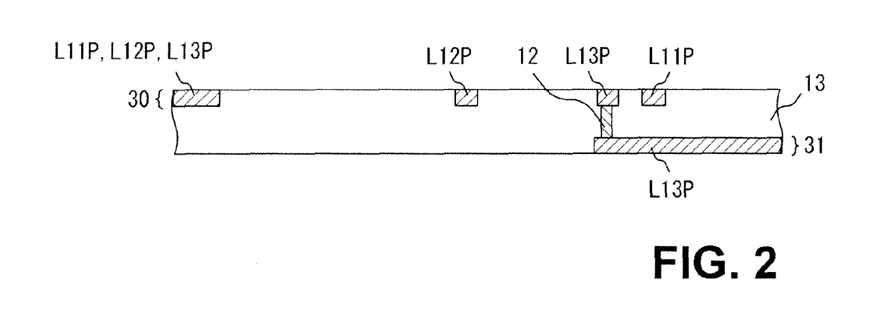
FIG. 2 is a sectional view of the inductor according to the first embodiment of the present invention.

An embodiment of the present invention will now be described with reference to the accompanying drawings. FIG. 1 is a plan view of an inductor according to the first embodiment of the present invention. FIG. 2 is a sectional view of the inductor taken along a line A-A in FIG. 1. Note that FIG. 1 perspectively illustrates a plurality of metal wiring layers. Referring to FIG. 1, an inductor 1 according to this embodiment includes a first shunt inductor L11P (first inductor wire), a second shunt inductor L12P (second inductor wire), and a first series inductor L13P (third inductor wire).

The rectangular or circular region where the inductors L11P, L12P, and L13P are formed will be referred to as an inductor region hereinafter. In the example shown in FIG. 1, a region indicated by the dotted line is the inductor region.

The first shunt inductor L11P is formed using a first metal wiring layer 30. The first shunt inductor L11P is formed into a spiral that makes a round on the outermost circumference of the inductor region clockwise when viewed from the upper side. The start point of the first shunt inductor L11P is connected to a terminal N11P.

The second shunt inductor L12P is formed using the first metal wiring layer 30. The second shunt inductor L12P is formed into a spiral that makes a ¾ round on the innermost circumference of the inductor region clockwise when viewed from the upper side, and has a start point at the end point of the first shunt inductor L11P. The end point of the second shunt inductor L12P is connected to a terminal N12P.

However, the second shunt inductor L12P crosses the first shunt inductor L11P and the first series inductor L13P on the way to the terminal N12P. Hence, the second shunt inductor L12P is connected to a second metal wiring layer 31 through a contact (via hole) 10, and thereafter formed to be connected to the terminal N12P using the second metal wiring layer 31. This allows to connect the second shunt inductor L12P to the terminal N12P without any contact with the first shunt inductor L11P and the first series inductor L13P.

The first series inductor L13P is formed using the first metal wiring layer 30. The first series inductor L13P is formed into a spiral that makes a ½ round on the circumference sandwiched between the first shunt inductor L11P and the second shunt inductor L12P counterclockwise when viewed from the upper side, and has a start point at a node 11 between the first shunt inductor L11P and the second shunt inductor L12P. That is, the first series inductor L13P is formed along the inner side of the first shunt inductor L11P in a winding direction reverse to that of the first shunt inductor L11P. The end point of the first series inductor L13P is connected to a terminal N13P.

However, the first series inductor L13P crosses the first shunt inductor L11P on the way to the terminal N13P. Hence, the first series inductor L13P is connected to the second metal wiring layer 31 through a contact 12, and thereafter formed to be connected to the terminal N13P using the second metal wiring layer 31. This allows to connect the first series inductor L13P to the terminal N13P without any contact with the first shunt inductor L11P.

As shown in FIG. 2, the first metal wiring layer 30 and the second metal wiring layer 31 are insulated from each other by an insulating layer 13. In this way, the inductor 1 can be made using the two metal wiring layers 30 and 31 and the insulating layer 13. The metal wiring layers 30 and 31 and the insulating layer 13 are formed on a semiconductor substrate (not shown).

The winding direction of the second shunt inductor L12P from the start point to the end point can be the same as or opposite to that of the first shunt inductor L11P from the start point to the end point. Similarly, the winding direction of the first series inductor L13P from the start point to the end point can be the same as or opposite to that of the first shunt inductor L11P from the start point to the end point. However, when extending the band of the circuit, the first shunt inductor L11P and the first series inductor L13P are coupled in reverse directions, thereby obtaining the effect of suppressing an increase in the peaking gain and setting the resonance frequency by the first series inductor L13P on the high frequency side.

In this embodiment, an example is shown in which the first metal wiring layer and the second metal wiring layer are used. However, it can easily be estimated that when more wiring layers are used, a structure with vertically stacked metal wiring layers can be formed, and the resistance value of the metal wiring layers can be decreased.

Figure 3:
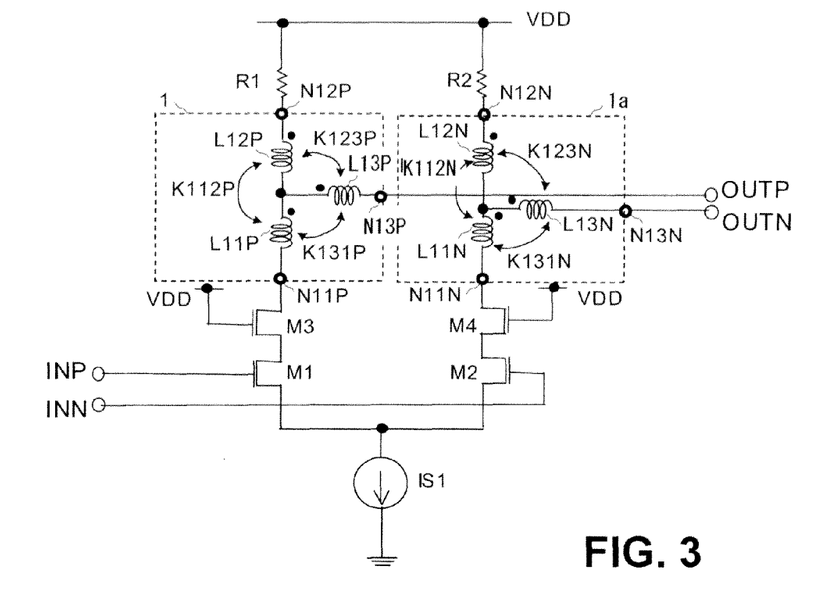
FIG. 3 is a circuit diagram of a CML circuit that uses the inductor according to the first embodiment of the present invention as a peaking circuit.

FIG. 3 shows a CML (Current Mode Logic) circuit that uses the inductor 1 of this embodiment shown in FIGS. 1 and 2 as a peaking circuit. The CML circuit includes a MOS transistor M1 having a gate connected to a positive-phase input terminal INP, a MOS transistor M2 having a gate connected to a negative-phase input terminal INN, a MOS transistor M3 having a gate connected to a power supply VDD and a source connected to the drain of the MOS transistor M1, a MOS transistor M4 having a gate connected to the power supply VDD and a source connected to the drain of the MOS transistor M2, a current source IS1 having an anode terminal commonly connected to the sources of the MOS transistors M1 and M2 and a grounded cathode, the inductor 1 having the terminal N11P connected to the drain of the MOS transistor M3 and the terminal N13P connected to an output terminal OUTP of the CML circuit, an inductor 1a having a terminal N11N connected to the drain of the MOS transistor M4 and a terminal N13N connected to an output terminal OUTN of the CML circuit, a load resistance R1 having one terminal connected to the power supply VDD and the other terminal connected to the terminal N12P of the inductor 1, and a load resistance R2 having one terminal connected to the power supply VDD and the other terminal connected to a terminal N12N of the inductor 1a.

The inductor 1 on the positive-phase side has the arrangement shown in FIGS. 1 and 2. The inductor 1a on the negative-phase side also has the same arrangement as that of the inductor 1. That is, the inductor 1a corresponds to a structure in which L11P, L12P, L13P, N11P, N12P, and N13P of the inductor 1 are replaced with L11N, L12N, L13N, N11N, N12N, and N13N, and a detailed description thereof will be omitted.

Referring to FIG. 3, K112P is a coupling coefficient between the first shunt inductor L11P and the second shunt inductor L12P, K131P is a coupling coefficient between the first shunt inductor L11P and the first series inductor L13P, and K123P is a coupling coefficient between the second shunt inductor L12P and the first series inductor L13P. Similarly, K112N is a coupling coefficient between the first shunt inductor L11N and the second shunt inductor L12N, K131N is a coupling coefficient between the first shunt inductor L11N and the first series inductor L13N, and K123N is a coupling coefficient between the second shunt inductor L12N and the first series inductor L13N.

The operation of the CML circuit using the inductors 1 and 1a of this embodiment will be explained. Differential signals are input to the positive-phase input terminal INP and the negative-phase input terminal INN of the CML circuit. Load capacitances (not shown) are connected to the output terminals OUTP and OUTN. The load capacitances are parasitic capacitance components attributed to the transistors and the like of a circuit connected to the subsequent stage of the CML circuit. The CML circuit is required to amplify the differential input signals by a desired gain. The desired gain is ideally obtained flat up to a desired high frequency band.

The amplitude of the voltage output from the output terminal OUTP of the CML circuit is determined by the product of the value of the resistance R1 and a current I flowing through the current source IS1 in DC terms. Similarly, the amplitude of the voltage output from the output terminal OUTN is determined by the product of the value of the resistance R2 and the current I in DC terms. The ratio of the output voltage amplitude to the input voltage amplitude is the gain of the CML circuit.

The high-frequency operation of the CML circuit on the positive-phase side will be described below. Assume that the inductor 1 is a wire without inductance. Then, the −3 dB-band on the positive-phase side of the CML circuit is determined by a time constant R1×C defined by the load resistance R1 and a total capacitance C including the load capacitance added to the output terminal OUTP and the parasitic capacitances of the terminals N11P and N12P. Hence, if the total capacitance C is large, the frequency band of the CML circuit is low.

On the other hand, in this embodiment, the load capacitance added to the output terminal OUTP is disconnected from the CML circuit in RF terms by the first series inductor L13P of the inductor 1. The parasitic capacitance of the terminal N11P is disconnected from the CML circuit in RF terms by the first shunt inductor L11P. The parasitic capacitance of the terminal N12P is disconnected from the CML circuit in RF terms by the second shunt inductor L12P.

Hence, the response of the output voltage of the CML circuit is determined by the high-frequency pole (resonance frequency) of a resonance circuit formed from the parasitic capacitance of the terminal N11P and the first shunt inductor L11P, the high-frequency pole of a resonance circuit formed from the parasitic capacitance of the terminal N12P and the second shunt inductor L12P, and the high-frequency pole of a resonance circuit formed from the load capacitance added to the output terminal OUTP and the first series inductor L13P. The high-frequency operation on the negative-phase side of the CML circuit can be explained by replacing the description about the output terminal OUTP and the inductor 1 with a description about the output terminal OUTN and the inductor 1a, and a description thereof will be omitted.

In this embodiment, the frequency band of the CML circuit can be extended by the peaking circuit formed from the inductors L11P, L12P, and L13P and the peaking circuit formed from the inductors L11N, L12N, and L13N in the above-described way. In this embodiment, the three inductors can be formed in the area of one inductor spiral. Hence, the peaking circuit that uses three inductors and has a large band extension effect can be formed in a small area. In this embodiment, the area of the inductors necessary for forming the peaking circuit can be reduced to ½ as compared to a case in which the inductors of the double-shunt form and the inductor of the series form are provided in separate inductor regions. As a result, according to this embodiment, it is possible to inexpensively provide a semiconductor integrated circuit that operates at a high speed.

In the conventional inductor disclosed in literature 1, the inductive coupling associated with the inductor L3*eff* cannot be used as a design parameter. Since the directivity of the inductive coupling between the double-shunt form and the series form cannot freely be selected, the degree of freedom is low in adjusting the values of the capacitances and inductors included in the peaking circuit for a desired peaking amount and peaking frequency. In the conventional inductor disclosed in literature 1, to set the peaking frequency on the low-frequency side, the inductor value needs to be set large. Hence, the peaking amount becomes too large. On the other hand, when the inductor value is set small to suppress the peaking amount, the peaking frequency becomes too high, and the desired flat band extension can hardly be obtained.

In this embodiment, however, the winding direction of each inductor and the distance between the inductors are changed at the time of design. This enables to freely select the coupling coefficients K131P and K123P and the coupling directions between the first and second shunt inductors L11P and L12P and the first series inductor L13P and adjust the relationship between the inductors and the capacitances. It is therefore possible to increase the degree of freedom in designing the peaking characteristic. On the negative-phase side as well, it is possible to freely select the coupling coefficients K131N and K123N and the coupling directions between the first and second shunt inductors L11N and L12N and the first series inductor L13N. In this embodiment, a larger band extension effect can be obtained by increasing the degree of freedom in designing the peaking characteristic.

Additionally, in this embodiment, the first series inductor L13P that is an inductor of the series form in the peaking circuit is formed in the winding direction reverse to that of the first shunt inductor L11P that is an inductor of the double-shunt form in the peaking circuit. When the first series inductor L13P is formed in the winding direction reverse to that of the first shunt inductor L11P, the degree of freedom in selecting the coupling direction is restricted, but the band extension effect of the peaking circuit can further be improved. Especially when the first series inductor L13P is formed in the reverse winding direction, the inductive coupling between the first series inductor L13P and the first shunt inductor L11P produces a function of moving the resonance frequency formed by the load capacitance and the first series inductor L13P connected to the terminal N13P to the high-frequency side. This function is different from the function obtained by simply decreasing the self-inductance of the first series inductor L13P.

Furthermore, in this embodiment, each inductor wire is formed using the first metal wiring layer and connected to the second metal wiring layer through a contact only at a portion where it crosses another inductor wire so as to prevent connection of the inductors. Hence, a plurality of inductors can be made by the two metal wiring layers. In this embodiment, since the number of layers necessary for forming an inductor can be suppressed, it is possible to inexpensively provide a semiconductor integrated circuit including a peaking circuit using a plurality of inductors.

Note that as is apparent from FIG. 1, the first series inductor L13P has a portion formed in a region sandwiched between the inner circumference of the first shunt inductor L11P and the inner circumference of the second shunt inductor L12P, and a portion formed in a region sandwiched between the inner circumference of the first shunt inductor L11P and the outer circumference of the second shunt inductor L12P. The first series inductor L13P can be formed in either of the two regions. The position where the first shunt inductor L11P and the first series inductor L13P are adjacent and the winding directions determine the value and sign of the mutual inductance.

Second Embodiment

Figure 4:
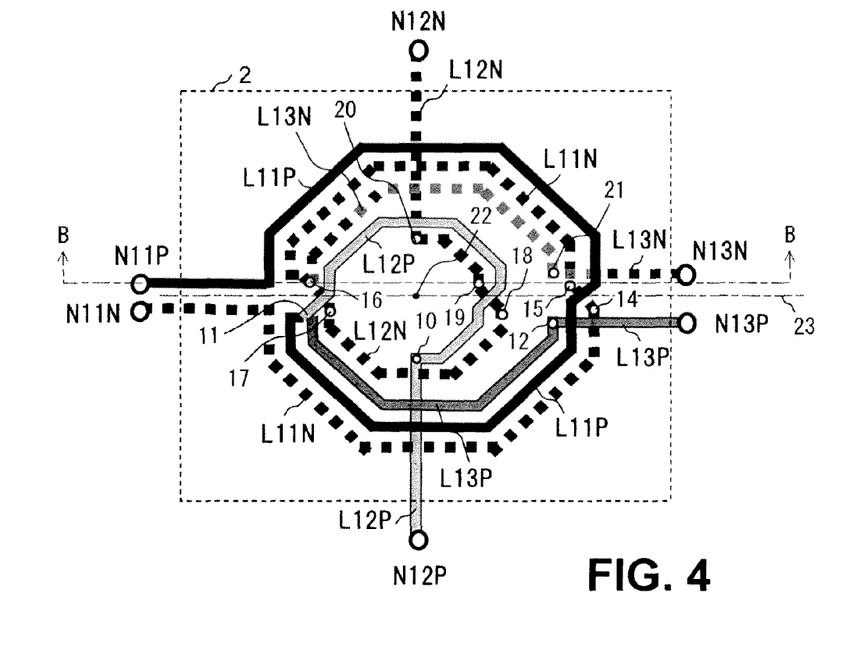
FIG. 4 is a plan view of an inductor according to the second embodiment of the present invention.
Figure 5:
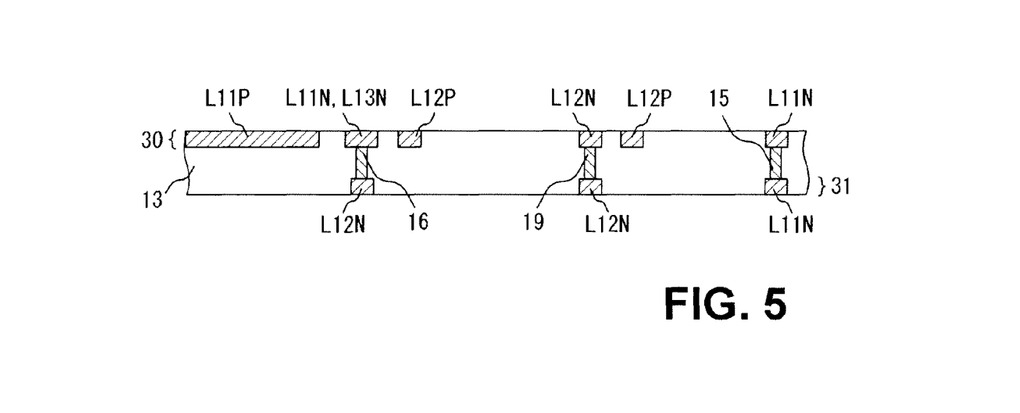
FIG. 5 is a sectional view of the inductor according to the second embodiment of the present invention.

The second embodiment will be described next. FIG. 4 is a plan view of an inductor according to the second embodiment of the present invention. FIG. 5 is a sectional view of the inductor taken along a line B-B in FIG. 4. Note that FIG. 4 perspectively illustrates a plurality of metal wiring layers. In this embodiment, three inductors used on the positive-phase side of a differential circuit and three inductors used on the negative-phase side are wound into one spiral. Referring to FIG. 4, an inductor 2 according to this embodiment includes a first shunt inductor L11P (first inductor wire) on the positive-phase side, a second shunt inductor L12P (second inductor wire) on the positive-phase side, a first series inductor L13P (third inductor wire) on the positive-phase side, a first shunt inductor L11N (fourth inductor wire) on the negative-phase side, a second shunt inductor L12N (fifth inductor wire) on the negative-phase side, and a first series inductor L13N (sixth inductor wire) on the negative-phase side. In FIG. 4, a region indicated by the dotted line is the inductor region, as in FIG. 1.

The first shunt inductor L11P on the positive-phase side is formed using a first metal wiring layer 30. The first shunt inductor L11P on the positive-phase side is formed into a spiral that makes a round on the outer circumference of the inductor region clockwise when viewed from the upper side. The start point of the first shunt inductor L11P on the positive-phase side is connected to a terminal N11P.

The second shunt inductor L12P on the positive-phase side is formed using the first metal wiring layer 30. The second shunt inductor L12P on the positive-phase side is formed into a spiral that makes a ¾ round on the inner circumference of the inductor region clockwise when viewed from the upper side, and has a start point at the end point of the first shunt inductor L11P on the positive-phase side. The end point of the second shunt inductor L12P on the positive-phase side is connected to a terminal N12P.

However, the second shunt inductor L12P on the positive-phase side crosses the first shunt inductor L11P on the positive-phase side, the first series inductor L13P on the positive-phase side, the first shunt inductor L11N on the negative-phase side, and the second shunt inductor L12N on the negative-phase side on the way to the terminal N12P. Hence, the second shunt inductor L12P on the positive-phase side is connected to a second metal wiring layer 31 through a contact (via hole) 10, and thereafter formed to be connected to the terminal N12P using the second metal wiring layer 31. This allows to connect the second shunt inductor L12P on the positive-phase side to the terminal N12P without any contact with the first shunt inductor L11P on the positive-phase side, the first series inductor L13P on the positive-phase side, the first shunt inductor L11N on the negative-phase side, and the second shunt inductor L12N on the negative-phase side.

The first series inductor L13P on the positive-phase side is formed using the first metal wiring layer 30. The first series inductor L13P on the positive-phase side is formed into a spiral that makes a ½ round on the circumference sandwiched between the first shunt inductor L11P on the positive-phase side and the second shunt inductor L12P on the positive-phase side counterclockwise when viewed from the upper side, and has a start point at a node 11 between the first shunt inductor L11P on the positive-phase side and the second shunt inductor L12P on the positive-phase side. That is, the first series inductor L13P on the positive-phase side is formed along the inner side of the first shunt inductor L11P on the positive-phase side in a winding direction reverse to that of the first shunt inductor L11P on the positive-phase side. The end point of the first series inductor L13P on the positive-phase side is connected to a terminal N13P.

However, the first series inductor L13P on the positive-phase side crosses the first shunt inductor L11P on the positive-phase side and the first shunt inductor L11N on the negative-phase side on the way to the terminal N13P. Hence, the first series inductor L13P on the positive-phase side is connected to the second metal wiring layer 31 through a contact 12, and thereafter formed to be connected to the terminal N13P using the second metal wiring layer 31. This allows to connect the first series inductor L13P on the positive-phase side to the terminal N13P without any contact with the first shunt inductor L11P on the positive-phase side and the first shunt inductor L11N on the negative-phase side.

The first shunt inductor L11N on the negative-phase side is formed using the first metal wiring layer 30. The first shunt inductor L11N on the negative-phase side is formed into a spiral that makes a round on the outer circumference of the inductor region counterclockwise when viewed from the upper side. The start point of the first shunt inductor L11N on the negative-phase side is connected to a terminal N11N.

However, the first shunt inductor L11N on the negative-phase side crosses the first shunt inductor L11P on the positive-phase side on the way from the start point to the end point. Hence, the first shunt inductor L11N on the negative-phase side is connected to the second metal wiring layer 31 through a contact 14, and formed using the second metal wiring layer 31 up to the position of a contact 15 where the crossing of the first shunt inductor L11P on the positive-phase side ends. The first shunt inductor L11N on the negative-phase side is then connected to the first metal wiring layer 30 through the contact 15, and thereafter formed using the first metal wiring layer 30 up to the position of the end point. This allows to form the first shunt inductor L11N on the negative-phase side without any contact with the first shunt inductor L11P on the positive-phase side.

The second shunt inductor L12N on the negative-phase side is formed using the first metal wiring layer 30. The second shunt inductor L12N on the negative-phase side is formed into a spiral that makes a ¾ round on the inner circumference of the inductor region counterclockwise when viewed from the upper side, and has a start point at the end point of the first shunt inductor L11N on the negative-phase side. The end point of the second shunt inductor L12N on the negative-phase side is connected to a terminal N12N.

However, the second shunt inductor L12N on the negative-phase side crosses the second shunt inductor L12P on the positive-phase side on the way from the start point to the terminal N12N. Hence, the second shunt inductor L12N on the positive-phase side is connected to the second metal wiring layer 31 through a contact 16, and formed using the second metal wiring layer 31 up to the position of a contact 17 where the crossing of the second shunt inductor L12P on the positive-phase side ends. The second shunt inductor L12N on the negative-phase side is then connected to the first metal wiring layer 30 through the contact 17.

The second shunt inductor L12N on the negative-phase side formed using the first metal wiring layer 30 crosses the second shunt inductor L12P on the positive-phase side again. Hence, the second shunt inductor L12N on the negative-phase side is connected to the second metal wiring layer 31 through a contact 18, and formed using the second metal wiring layer 31 up to the position of a contact 19 where the crossing of the second shunt inductor L12P on the positive-phase side ends. The second shunt inductor L12N on the negative-phase side is then connected to the first metal wiring layer 30 through the contact 19.

The second shunt inductor L12N on the negative-phase side also crosses the first shunt inductor L11P on the positive-phase side, the second shunt inductor L12P on the positive-phase side, the first shunt inductor L11N on the negative-phase side, and the first series inductor L13N on the negative-phase side. Hence, the second shunt inductor L12N on the negative-phase side is connected to the second metal wiring layer 31 through a contact 20, and thereafter formed to be connected to the terminal N12N using the second metal wiring layer 31. This allows to connect the second shunt inductor L12N on the negative-phase side to the terminal N12N without any contact with the first shunt inductor L11P on the positive-phase side, the second shunt inductor L12P on the positive-phase side, the first shunt inductor L11N on the negative-phase side, and the first series inductor L13N on the negative-phase side.

The first series inductor L13N on the negative-phase side is formed using the first metal wiring layer 30. The first series inductor L13N on the negative-phase side is formed into a spiral that makes a ½ round on the circumference sandwiched between the first shunt inductor L11N on the negative-phase side and the second shunt inductor L12N on the negative-phase side clockwise when viewed from the upper side, and has a start point at the position of the contact 16 that is the node between the first shunt inductor L11N on the negative-phase side and the second shunt inductor L12N on the negative-phase side. That is, the first series inductor L13N on the negative-phase side is formed along the inner side of the first shunt inductor L11N on the negative-phase side in a winding direction reverse to that of the first shunt inductor L11N on the negative-phase side. The end point of the first series inductor L13N on the negative-phase side is connected to a terminal N13N.

However, the first series inductor L13N on the negative-phase side crosses the first shunt inductor L11P on the positive-phase side and the first shunt inductor L11N on the negative-phase side on the way to the terminal N13N. Hence, the first series inductor L13N on the negative-phase side is connected to the second metal wiring layer 31 through a contact 21, and thereafter formed to be connected to the terminal N13N using the second metal wiring layer 31. This allows to connect the first series inductor L13N on the negative-phase side to the terminal N13N without any contact with the first shunt inductor L11P on the positive-phase side and the first shunt inductor L11N on the negative-phase side.

As shown in FIG. 5, the first metal wiring layer 30 and the second metal wiring layer 31 are insulated from each other by an insulating layer 13, as in the first embodiment. In this way, the inductor 2 can be made using the two metal wiring layers 30 and 31 and the insulating layer 13. The metal wiring layers 30 and 31 and the insulating layer 13 are formed on a semiconductor substrate (not shown).

The winding direction of the second shunt inductor L12P on the positive-phase side from the start point to the end point can be the same as or opposite to that of the first shunt inductor L11P on the positive-phase side from the start point to the end point. The winding direction of the first series inductor L13P on the positive-phase side from the start point to the end point can be the same as or opposite to that of the first shunt inductor L11P on the positive-phase side from the start point to the end point. In addition, the winding direction of the second shunt inductor L12N on the negative-phase side from the start point to the end point can be the same as or opposite to that of the first shunt inductor L11N on the negative-phase side from the start point to the end point. The winding direction of the first series inductor L13N on the negative-phase side from the start point to the end point can be the same as or opposite to that of the first shunt inductor L11N on the negative-phase side from the start point to the end point.

As shown in FIG. 4, in the inductor 2, the first shunt inductor L11N on the negative-phase side is formed to be axially symmetrical with respect to the first shunt inductor L11P on the positive-phase side about a line 23 that passes through a center 22 of the spirals of the inductors L11P, L12P, L13P, L11N, L12N, and L13N on the positive-phase side and the negative-phase side and is parallel to the plane on which the spirals are formed. The second shunt inductor L12N on the negative-phase side is formed to be axially symmetrical with respect to the second shunt inductor L12P on the positive-phase side about the line 23. The first series inductor L13N on the negative-phase side is formed to be axially symmetrical with respect to the first series inductor L13P on the positive-phase side about the line 23. As described above, in this embodiment, the inductors L11P, L12P, and L13P on the positive-phase side and the inductors L11N, L12N, and L13N on the negative-phase side are arranged in axial symmetry. This allows to implement an optimum layout for integrating the six inductors necessary for the peaking circuit for the differential signals using a small number of layers. Note that when the inductors L11P, L12P, and L13P on the positive-phase side and the inductors L11N, L12N, and L13N on the negative-phase side are arranged in axial symmetry, a large mutual inductance can be obtained. If the mutual inductance can be somewhat small, for example, the inductors L11P, L12P, and L13P on the positive-phase side or the inductors L11N, L12N, and L13N on the negative-phase side may be rotated by several to 45 degrees without shifting the center 22 of the spirals for the convenience of the circuit layout.

Figure 6:
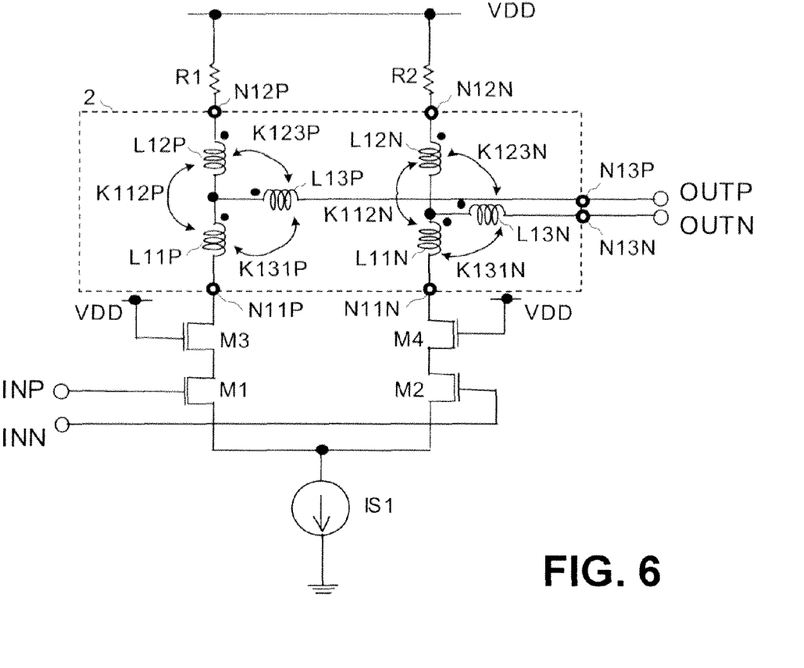
FIG. 6 is a circuit diagram of a CML circuit that uses the inductor according to the second embodiment of the present invention as a peaking circuit.

FIG. 6 shows a CML circuit that uses the inductor 2 shown in FIGS. 4 and 5 as a peaking circuit. The CML circuit includes a MOS transistor M1 having a gate connected to a positive-phase input terminal INP, a MOS transistor M2 having a gate connected to a negative-phase input terminal INN, a MOS transistor M3 having a gate connected to a power supply VDD and a source connected to the drain of the MOS transistor M1, a MOS transistor M4 having a gate connected to the power supply VDD and a source connected to the drain of the MOS transistor M2, a current source IS1 having an anode terminal commonly connected to the sources of the MOS transistors M1 and M2 and a grounded cathode, the inductor 2 having the terminal N11P connected to the drain of the MOS transistor M3, the terminal N11N connected to the drain of the MOS transistor M4, the terminal N13P connected to an output terminal OUTP of the CML circuit, and the terminal N13N connected to an output terminal OUTN of the CML circuit, a load resistance R1 having one terminal connected to the power supply VDD and the other terminal connected to the terminal N12P of the inductor 2, and a load resistance R2 having one terminal connected to the power supply VDD and the other terminal connected to the terminal N12N of the inductor 2.

The operation of the CML circuit using the inductor 2 of this embodiment will be explained. Differential signals are input to the positive-phase input terminal INP and the negative-phase input terminal INN of the CML circuit. Load capacitances (not shown) are connected to the output terminals OUTP and OUTN. As described in the first embodiment, the load capacitances are parasitic capacitance components attributed to the transistors and the like of a circuit connected to the subsequent stage of the CML circuit. The CML circuit is required to amplify the differential input signals by a desired gain. The desired gain is ideally obtained flat up to a desired high frequency band.

The amplitude of the voltage output from the output terminal OUTP of the CML circuit is determined by the product of the value of the resistance R1 and a current I flowing through the current source IS1 in DC terms. Similarly, the amplitude of the voltage output from the output terminal OUTN is determined by the product of the value of the resistance R2 and the current I in DC terms. The ratio of the output voltage amplitude to the input voltage amplitude is the gain of the CML circuit.

The high-frequency operation of the CML circuit on the positive-phase side will be described below. Assume that the inductor 2 is a wire without inductance. Then, the −3 dB-band on the positive-phase side of the CML circuit is determined by a time constant R1×C determined by the load resistance R1 and a total capacitance C including the load capacitance added to the output terminal OUTP and the parasitic capacitances of the terminals N11P and N12P. Hence, if the total capacitance C is large, the frequency band of the CML circuit is low.

On the other hand, in this embodiment, the load capacitance added to the output terminal OUTP is disconnected from the CML circuit in RF terms by the first series inductor L13P on the positive-phase side of the inductor 2. The parasitic capacitance of the terminal N11P is disconnected from the CML circuit in RF terms by the first shunt inductor L11P on the positive-phase side. The parasitic capacitance of the terminal N12P is disconnected from the CML circuit in RF terms by the second shunt inductor L12P on the positive-phase side.

Hence, the response of the output voltage of the CML circuit is determined by the high-frequency pole (resonance frequency) of a resonance circuit formed from the parasitic capacitance of the terminal N11P and the first shunt inductor L11P on the positive-phase side, the high-frequency pole of a resonance circuit formed from the parasitic capacitance of the terminal N12P and the second shunt inductor L12P on the positive-phase side, and the high-frequency pole of a resonance circuit formed from the load capacitance added to the output terminal OUTP and the first series inductor L13P on the positive-phase side. The high-frequency operation on the negative-phase side of the CML circuit can be explained by replacing the description about the output terminal OUTP and the inductors L11P, L12P, and L13P on the positive-phase side with a description about the output terminal OUTN and the inductors L11N, L12N, and L13N on the negative-phase side, and a description thereof will be omitted.

In this embodiment, the frequency band of the CML circuit can be extended by the peaking circuit formed from the inductors L11P, L12P, and L13P on the positive-phase side and the peaking circuit formed from the inductors L11N, L12N, and L13N on the negative-phase side in the above-described way. In this embodiment, the three inductors on the positive-phase side and the three inductors on the negative-phase side can be formed in the area of one inductor spiral. Hence, the peaking circuit that uses three inductors on each of the positive- and negative-phase sides and has a large band extension effect can be formed in a small area. In this embodiment, the area of the inductors necessary for forming the peaking circuit can be reduced to ¼ as compared to a case in which the inductors of the double-shunt form and the inductor of the series form are provided in separate inductor regions. The area of the inductors necessary for forming the inductors can be reduced to ½ as compared to the first embodiment in which the inductors on the positive-phase side and the inductors on the negative-phase side are separately formed. As a result, according to this embodiment, it is possible to inexpensively provide a semiconductor integrated circuit that operates at a high speed.

In the conventional inductor disclosed in literature 1, the inductive coupling associated with the inductor L3*eff* cannot be used as a design parameter. Since the directivity of the inductive coupling between the double-shunt form and the series form cannot freely be selected, the degree of freedom is low in adjusting the values of the capacitances and inductors included in the peaking circuit for a desired peaking amount and peaking frequency.

In this embodiment, however, the order to adjacently arrange the inductors, the winding direction of each inductor, and the distance between the inductors are changed at the time of design. This enables to freely select the coupling coefficients K131P and K123P and the coupling directions between the first and second shunt inductors L11P and L12P on the positive-phase side and the first series inductor L13P on the positive-phase side and adjust the relationship between the inductors and the capacitances. It is therefore possible to increase the degree of freedom in designing the peaking characteristic. On the negative-phase side as well, it is possible to freely select the coupling coefficients K131N and K123N and the coupling directions between the first and second shunt inductors L11N and L12N on the negative-phase side and the first series inductor L13N on the negative-phase side. In this embodiment, a larger band extension effect can be obtained by increasing the degree of freedom in designing the peaking characteristic. Furthermore, in this embodiment, the inductor group on the positive-phase side and the inductor group on the negative-phase side can strongly be inductively coupled. As a result, in this embodiment, the band extension effect of the peaking circuit can be enhanced as compared to a case in which the conventional inductor is used.

Additionally, in this embodiment, the first series inductor L13N on the negative-phase side that is an inductor of the series form in the peaking circuit is formed in the winding direction reverse to that of the first shunt inductor L11N on the negative-phase side that is an inductor of the double-shunt form in the peaking circuit. When the first series inductor L13N on the negative-phase side is formed in the winding direction reverse to that of the first shunt inductor L11N on the negative-phase side, the degree of freedom in selecting the coupling direction is restricted, but the band extension effect of the peaking circuit can further be improved.

Furthermore, in this embodiment, each inductor wire is formed using the first metal wiring layer and connected to the second metal wiring layer through a contact only at a portion where it crosses another inductor wire. Hence, a plurality of inductors can be made by the two metal wiring layers. In this embodiment, since the number of layers necessary for forming an inductor can be suppressed, it is possible to inexpensively provide a semiconductor integrated circuit including a peaking circuit using a plurality of inductors.

Figure 7:
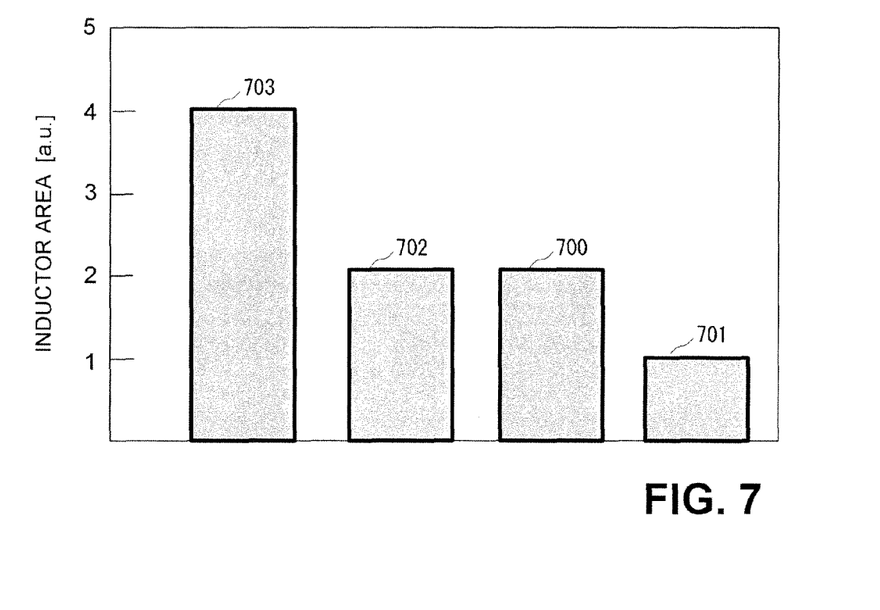
FIG. 7 is a graph for explaining area reduction effects by the inductors according to the first and second embodiments of the present invention.

The inductor area reduction effects of the first and second embodiments will be described with reference to FIG. 7. FIG. 7 shows the area of inductors that form a peaking circuit having a differential arrangement as shown in FIG. 3. In FIG. 7, an area is normalized by defining the area of the inductor 2 according to the second embodiment as 1. The area of one inductor 2 will be referred to as an inductor region hereinafter. Referring to FIG. 7, reference numeral 700 represents the total area of the inductors 1 and 1a of the first embodiment; 701, the area of the inductor 2 of the second embodiment; 702, the total area when the conventional inductor disclosed in literature 1 is provided on each of the positive- and negative-phase sides; and 703, the total area when series inductors on the positive- and negative phase sides are separately added to the conventional inductors.

According to the conventional inductor disclosed in literature 1, the double-shunt form is formed in one inductor region. When an inductor of the series form is added to the inductor of the double-shunt form, two inductor regions are necessary only on the positive-phase side. For this reason, the area of four inductor regions is necessary in the entire differential circuit, as indicated by 703 in FIG. 7. If the inductor of the series form is equivalently formed by the double-shunt form, as described with reference to FIG. 12, two inductor regions can be reduced, as indicated by 702 in FIG. 7. However, the inductive coupling between the inductor of the double-shunt form and the inductor of the series form cannot be made to contribute to band extension.

On the other hand, according to the first embodiment, the peaking circuit capable of using the inductive coupling between the inductor of the double-shunt form and the inductor of the series form can be formed in two inductor regions. According to the second embodiment, the peaking circuit having the differential arrangement can be formed in one inductor region.

Figure 8:
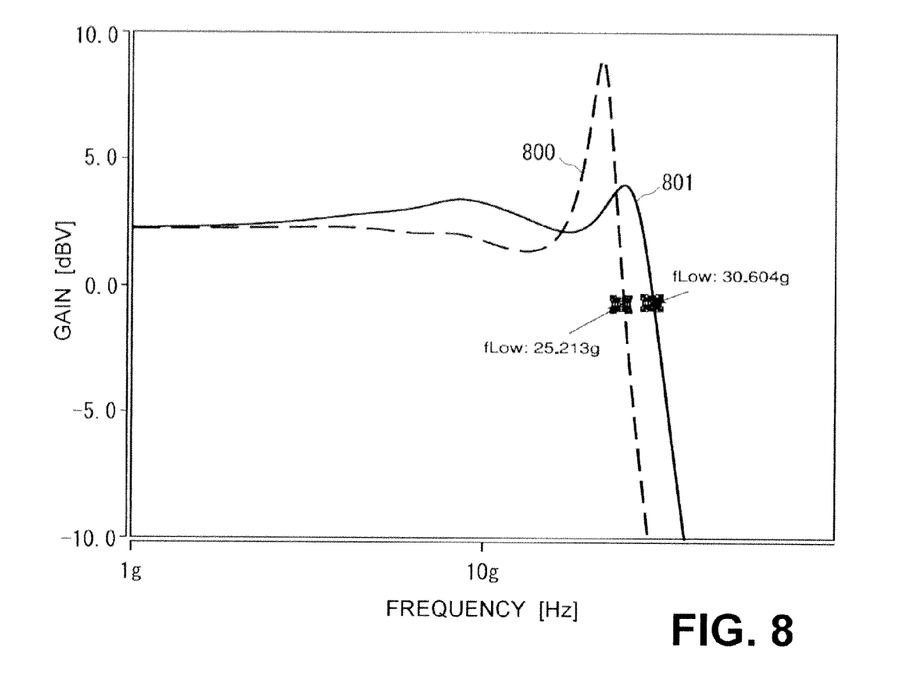
FIG. 8 is a graph for explaining a band extension effect by the inductor according to the second embodiment of the present invention.

The band extension effects by the conventional inductor and the inductor of the second embodiment will be described next with reference to FIG. 8. Referring to FIG. 8, reference numeral 800 represents the frequency characteristic of a CML circuit using the conventional inductor disclosed in literature 1; and 801, the frequency characteristic of a CML circuit using the inductor 2 according to the second embodiment. The CML circuit was formed using a 0.18-µm CMOS transistor. A circuit twice larger was connected as the load of the CML circuit. The gain of the CML circuit was calculated by simulations.

In the CML circuit using the conventional inductor, the inductors L11P and L11N shown in FIG. 6 were set to 0.335 nH, the inductors L12P and L12N were set to 0.210 nH, the inductors L13P and L13N were set to 0.225 nH, and all the coupling coefficients K112P, K131P, K123P, K112N, K131N, and K123N between the inductors were set to 0. The values of the inductors were adjusted by simulations and determined to values that extended the frequency band of the CML circuit best.

On the other hand, the frequency characteristic of the CML circuit simulated using the inductance values and coupling coefficients extracted by actually laying out the inductor 2 of the second embodiment and performing electromagnetic field analysis is the characteristic represented by 801 in FIG. 8. At this time, the inductors L11P and L11N were set to 0.335 nH, the inductors L12P and L12N were set to 0.110 nH, the inductors L13P and L13N were set to 0.125 nH.

The coupling coefficient K112P between the inductors L11P and L12P was 0.2, the coupling coefficient K131P between the inductors L11P and L13P was −0.4, the coupling coefficient between the inductors L11P and L11N was −0.67, the coupling coefficient between the inductors L11P and L12N was −0.2, and the coupling coefficient between the inductors L11P and L13N was 0.33.

The coupling coefficient between the inductors L12P and L11N was −0.2, the coupling coefficient between the inductors L12P and L12N was −0.4, the coupling coefficient between the inductors L12P and L13N was 0.34, the coupling coefficient between the inductors L13P and L11N was 0.33, the coupling coefficient between the inductors L13P and L12N was 0.34, the coupling coefficient K112N between the inductors L11N and L12N was 0.2, the coupling coefficient K131N between the inductors L11N and L13N was −0.4. A coupling coefficient whose absolute value was smaller than 0.1 was defined as 0.

As is apparent from FIG. 8, the mutual inductive coupling between the inductors implemented by the second embodiment allows to obtain a band extension effect larger than that of the CML circuit using the conventional inductor by more than 20% and also obtain a flat gain characteristic.

Figure 9:
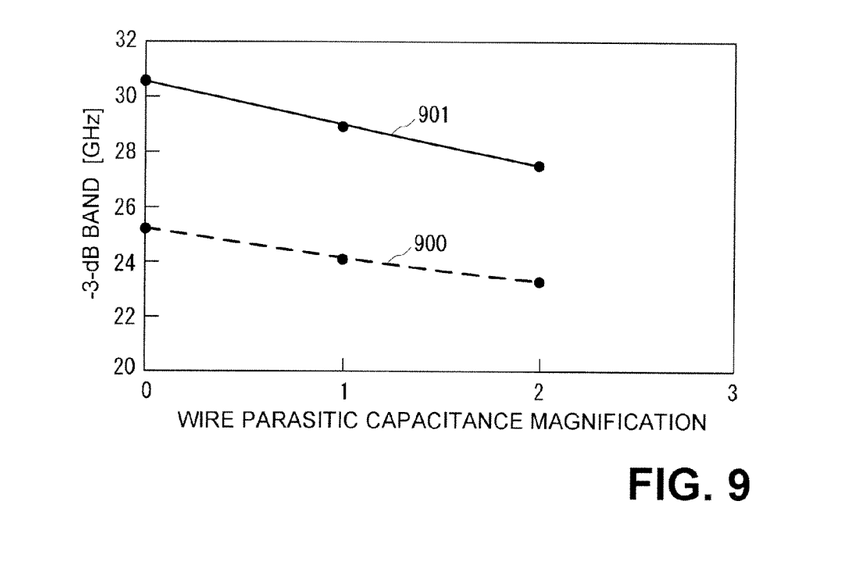
FIG. 9 is a graph for explaining a band extension effect by the inductor according to the second embodiment of the present invention.

The band extension effect by the inductor according to the second embodiment will further be described with reference to FIG. 9. Referring to FIG. 9, reference numeral 900 represents a −3-dB band of the CML circuit using the conventional inductor disclosed in literature 1; and 901, a −3-dB band of the CML circuit using the inductor of the second embodiment. In the example shown in FIG. 9, the inductors were assumed to be formed by the metal wiring layers of a semiconductor integrated circuit. The −3-dB band of the CML circuit when an earth capacitance corresponding to the parasitic capacitance of a metal wire was added to each inductor was calculated by simulations. The values of the inductors and the values of the coupling coefficients of the CML circuit using the conventional inductor and the values of the inductors and the values of the coupling coefficients of the CML circuit using the inductor of the second embodiment are the same as the values employed by the simulations shown in FIG. 8.

FIG. 9 shows the calculated value of the −3-dB band of each CML circuit by defining a case in which a parasitic capacitance is added to each inductor of the CML circuit as a wire parasitic capacitance magnification "1", a case in which a parasitic capacitance is doubled and added as a wire parasitic capacitance magnification "2", and a case in which no parasitic capacitance is added as a wire parasitic capacitance magnification "0". Note that in the CML circuit using the conventional inductor, since the inductor L3eff is virtually formed, as shown in FIG. 12, only the inductor L3eff is added with no parasitic capacitance.

In the CML circuit using the inductor of the second embodiment, the band lowers by about 1.5 GHz due to the parasitic capacitance. However, in the CML circuit using the conventional inductor as well, the band lowers by about 1 GHz due to the parasitic capacitance. As is apparent from FIG. 9, the CML circuit using the inductor of the second embodiment can obtain a band extension effect higher by about 20% than that of the CML circuit using the conventional inductor independently of the presence/absence of the parasitic capacitance.

The parasitic capacitance added to the inductor can be divided into an earth capacitance formed between the substrate and the metal wiring layer for forming the inductor and a line capacitance formed between the adjacent metal wiring layers. The earth capacitance changes depending on the used semiconductor process or the used metal wiring layer. The line capacitance depends on how much the adjacent metal wiring layer is made close. FIG. 9 described above shows an example in which the distance between the semiconductor substrate and the metal wire of the inductor is 1 μm, the distance between the adjacent metal wires is 2 μm, and the width of the metal wire of the inductor is 6 μm. Since the distance between the semiconductor substrate an the metal wire is shorter than the distance between the metal wires, the earth capacitance accounts for most of the parasitic capacitance added to the inductor. When the upper metal wire far apart from the semiconductor substrate is used as the metal wire of the inductor, the band extension effect indicated by the wire parasitic capacitance magnifications "0" to "1" in FIG. 9 is obtained. When the distance between the metal wires becomes short, and the line capacitance becomes larger than the earth capacitance, the band extension effect indicated by the wire parasitic capacitance magnifications "1" to "2" in FIG. 9 is obtained.

Figure 10:
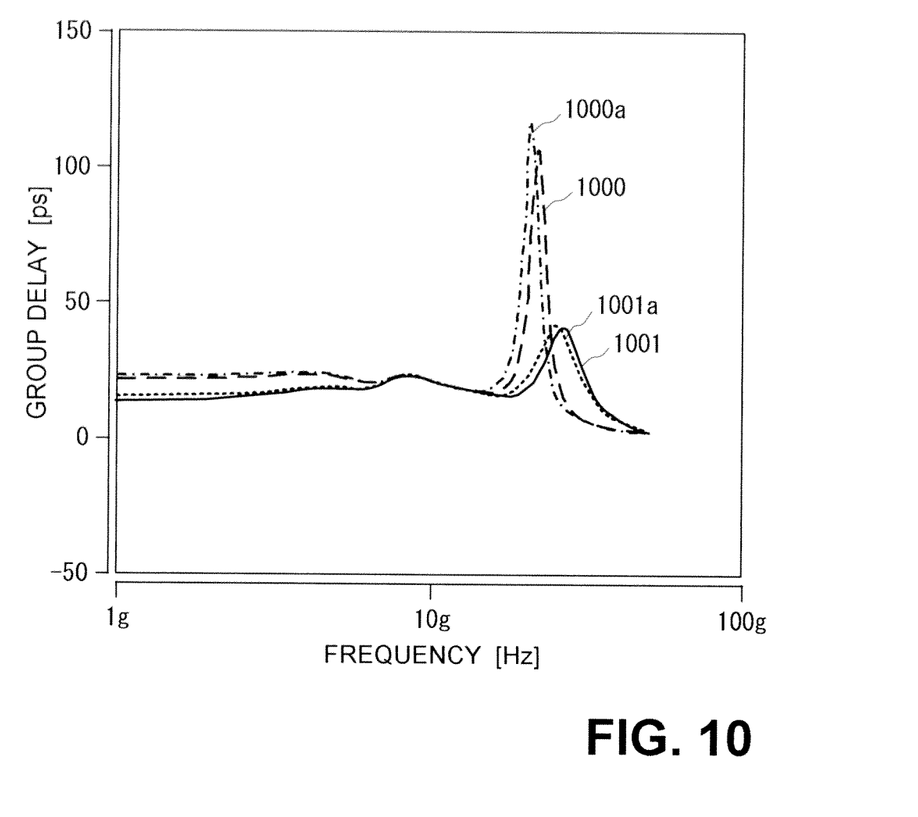
FIG. 10 is a graph showing the group delays of a CML circuit using a conventional inductor and a CML circuit using the inductor according to the second embodiment of the present invention.

FIG. 10 is a graph showing the group delays of the CML circuit using the conventional inductor disclosed in literature 1 and the CML circuit using the inductor of the second embodiment, which were obtained by simulations. Referring to FIG. 10, reference numeral 1000 represents a group delay of the CML circuit using the conventional inductor at the wire parasitic capacitance magnification "0"; 1000a, a group delay of the CML circuit using the conventional inductor at the wire parasitic capacitance magnification "1"; 1001 represents a group delay of the CML circuit using the inductor of the second embodiment at the wire parasitic capacitance magnification "0"; and 1001a, a group delay of the CML circuit using the inductor of the second embodiment at the wire parasitic capacitance magnification "1".

If the group delay deviation is large between the frequencies in the band of the signal to be amplified, jitter or distortion occurs in the output waveform. As is apparent from FIG. 10, the tendency of the group delay does not largely change depending on the presence/absence of the parasitic capacitance. In the CML circuit using the conventional inductor, the group delay at 1 GHz is 24 ps, and that at a high frequency peak higher than 10 GHz is 140 ps at maximum. That is, a group delay deviation of 116 ps is exhibited at maximum. On the other hand, in the CML circuit using the inductor of the second embodiment, the group delay at 1 GHz is 17 ps, and that at a high frequency peak higher than 10 GHz is 59 ps at maximum. The group delay deviation is suppressed to 42 ps at maximum. As described above, the CML circuit using the inductor of the second embodiment decreases the group delay deviation to about 1/3.7 of that of the CML circuit using the conventional inductor. This allows not only to extend the band but also to reduce the jitter or distortion in the output waveform.

Note that the effects of the second embodiment have been described with reference to FIGS. 9 and 10. In the first embodiment as well, the effects equal to or larger than those of the second embodiment can be obtained. This is because in the first embodiment, the distance between the metal wires of the inductor is longer, and the line capacitance is smaller as compared to the second embodiment.

As is apparent from FIG. 4, the first series inductor L13P on the positive-phase side has a portion formed in a region sandwiched between the inner circumference of the first shunt inductor L11P on the positive-phase side and the inner circumference of the second shunt inductor L12P on the positive-phase side, and a portion formed in a region sandwiched between the inner circumference of the first shunt inductor L11P on the positive-phase side and the outer circumference of the second shunt inductor L12P on the positive-phase side. The first series inductor L13P on the positive-phase side can be formed in either of the two regions. The position where the first shunt inductor L11P on the positive-phase side and the first series inductor L13P on the positive-phase side are adjacent and the winding directions determine the value and sign of the mutual inductance.

Similarly, the first series inductor L13N on the negative-phase side has a portion formed in a region sandwiched between the inner circumference of the first shunt inductor L11N on the negative-phase side and the inner circumference of the second shunt inductor L12N on the negative-phase side, and a portion formed in a region sandwiched between the inner circumference of the first shunt inductor L11N on the negative-phase side and the outer circumference of the second shunt inductor L12N on the negative-phase side. The first series inductor L13N on the negative-phase side can be formed in either of the two regions. The position where the first shunt inductor L11N on the negative-phase side and the first series inductor L13N on the negative-phase side are adjacent and the winding directions determine the value and sign of the mutual inductance.

INDUSTRIAL APPLICABILITY

The present invention is applicable to an inductor used for a peaking circuit or the like which extends the frequency band of a semiconductor integrated circuit.

EXPLANATION OF THE REFERENCE NUMERALS AND SIGNS 1, 1a . . . inductor, 10, 12, 14 to 21 . . . contact, 11 . . . node, 13 . . . insulating layer, 30, 31 . . . metal wiring layer, L11P, L12P, L11N, L12N . . . shunt inductor, L13P, L13N . . . series inductor, M1, M2, M3, M4 . . . MOS transistor, IS1 . . . current source, R1, R2 . . . load resistance.

The invention claimed is:

1. An inductor comprising:
   a first inductor wire formed into a shape of a spiral on an outer circumference of an inductor region and having a start point connected to a first terminal;
   a second inductor wire formed into a shape of a spiral on an inner circumference of the inductor region and having a start point at an end point of said first inductor wire and an end point connected to a second terminal; and
   a third inductor wire formed into a shape of a spiral in a region sandwiched between said first inductor wire and said second inductor wire and having a start point at a node between said first inductor wire and said second inductor wire and an end point connected to a third terminal;
   wherein said first inductor wire bifurcates at said end point thereof to said second inductor wire and said third inductor wire.

2. An inductor according to claim 1, wherein said third inductor wire is formed along an inner side of said first inductor wire in a winding direction reverse to that of said first inductor wire.

3. An inductor according to claim 1, further comprising:
   a fourth inductor wire formed into a shape of a spiral on the outer circumference of the inductor region and having a start point connected to a fourth terminal;
   a fifth inductor wire formed into a shape of a spiral on the inner circumference of the inductor region and having a start point at an end point of said fourth inductor wire and an end point connected to a fifth terminal; and
   a sixth inductor wire formed into a shape of a spiral in a region sandwiched between said fourth inductor wire and said fifth inductor wire and having a start point at a node between said fourth inductor wire and said fifth inductor wire and an end point connected to a sixth terminal,
   wherein said fourth inductor wire is formed to be axially symmetrical with respect to said first inductor wire about a line which passes through a center of the spirals of said first to sixth inductor wires and is parallel to a plane on which the spirals are formed,
   said fifth inductor wire is formed to be axially symmetrical with respect to said second inductor wire about the line, and
   said sixth inductor wire is formed to be axially symmetrical with respect to said third inductor wire about the line.

4. An inductor according to claim 3, wherein said sixth inductor wire is formed along an inner side of said fourth inductor wire in a winding direction reverse to that of said fourth inductor wire.

5. An inductor according to claim 1, wherein any one of said first to third inductor wires is formed using a first metal wiring layer and connected to a second metal wiring layer through a contact only at a portion where the inductor wire crosses another inductor wire so as to prevent connection of the inductors.

6. An inductor according to claim 3, wherein any one of said first to sixth inductor wires is formed using a first metal wiring layer and connected to a second metal wiring layer through a contact only at a portion where the inductor wire crosses another inductor wire so as to prevent connection of the inductors.

7. A peaking circuit comprising:
   a first transistor and a second transistor which have a differential arrangement to which differential signals are input;
   a current source which supplies a constant current to said first transistor and said second transistor;
   a first load resistance and a second load resistance each of which has one terminal connected to said current source;
   a first inductor having a first terminal connected to an output terminal of said first transistor on a positive-phase side, a second terminal connected to the other terminal of said first load resistance, and a third terminal connected to an output terminal of a circuit on the positive-phase side; and
   a second inductor having a first terminal connected to an output terminal of said second transistor on a negative-phase side, a second terminal connected to the other terminal of said second load resistance, and a third terminal connected to an output terminal of the circuit on the on the negative-phase side,
   each inductor comprising:
   a first inductor wire formed into a shape of a spiral on an outer circumference of an inductor region and having a start point connected to the first terminal;
   a second inductor wire formed into a shape of a spiral on an inner circumference of the inductor region and having a start point at an end point of said first inductor wire and an end point connected to the second terminal; and
   a third inductor wire formed into a shape of a spiral in a region sandwiched between said first inductor wire and said second inductor wire and having a start point at a node between said first inductor wire and said second inductor wire and an end point connected to the third terminal,
   wherein said first inductor and said second inductor are formed in separate inductor regions.

8. A peaking circuit comprising:
   a first transistor and a second transistor which have a differential arrangement to which differential signals are input;
   a current source which supplies a constant current to said first transistor and said second transistor;
   a first load resistance and a second load resistance each of which has one terminal connected to said current source;
   a first inductor having a first terminal connected to an output terminal of said first transistor on a positive-phase side, a second terminal connected to the other terminal of said first load resistance, and a third terminal connected to an output terminal of a circuit on the positive-phase side; and
   a second inductor having a fourth terminal connected to an output terminal of said second transistor on a negative-phase side, a fifth terminal connected to the other terminal of said second load resistance, and a sixth terminal connected to an output terminal of the circuit on the on the negative-phase side,
   said first inductor comprising:
   a first inductor wire formed into a shape of a spiral on an outer circumference of an inductor region and having a start point connected to the first terminal;
   a second inductor wire formed into a shape of a spiral on an inner circumference of the inductor region and having a start point at an end point of said first inductor wire and an end point connected to the second terminal; and a third inductor wire formed into a shape of a spiral in a region sandwiched between said first inductor wire and said second inductor wire and having a start point at a node between said first inductor wire and said second inductor wire and an end point connected to the third terminal, and said second inductor comprising:

a fourth inductor wire formed into a shape of a spiral on the outer circumference of the inductor region and having a start point connected to the fourth terminal;

a fifth inductor wire formed into a shape of a spiral on the inner circumference of the inductor region and having a start point at an end point of said fourth inductor wire and an end point connected to the fifth terminal; and a sixth inductor wire formed into a shape of a spiral in a region sandwiched between said fourth inductor wire and said fifth inductor wire and having a start point at a node between said fourth inductor wire and said fifth inductor wire and an end point connected to the sixth terminal, wherein said fourth inductor wire is formed to be axially symmetrical with respect to said first inductor wire about a line which passes through a center of the spirals of said first to sixth inductor wires and is parallel to a plane on which the spirals are formed, said fifth inductor wire is formed to be axially symmetrical with respect to said second inductor wire about the line, and said sixth inductor wire is formed to be axially symmetrical with respect to said third inductor wire about the line.

* * * * *